US007326062B2

(12) United States Patent
Kok-Soon et al.

(10) Patent No.: US 7,326,062 B2
(45) Date of Patent: Feb. 5, 2008

(54) SYSTEM AND METHOD FOR INCREASING THE SURFACE MOUNTING STABILITY OF A LAMP

(75) Inventors: Chai Kok-Soon, Penang (MY); Wong Fu-Mauh, Penanag (MY)

(73) Assignee: Avago Technologies ECBU IP Pte Ltd, Singapore (SG)

( * ) Notice: Subject to any disclaimer, the term of this patent is extended or adjusted under 35 U.S.C. 154(b) by 395 days.

(21) Appl. No.: 11/052,385

(22) Filed: Feb. 7, 2005

(65) Prior Publication Data

US 2006/0175615 A1  Aug. 10, 2006

(51) Int. Cl.
*H01R 12/00* (2006.01)
(52) U.S. Cl. .............................. 439/56; 257/79; 257/99
(58) Field of Classification Search ................. 439/56, 439/83, 619; 257/79, 99
See application file for complete search history.

(56) References Cited

U.S. PATENT DOCUMENTS 5,531,613 A * 7/1996 Takano et al. ............... 439/544

| | | | | |
|---|---|---|---|---|
| 6,809,261 B1 * | 10/2004 | Ng et al. | ..................... | 174/551 |
| 7,053,414 B2 * | 5/2006 | Su et al. | ........................ | 257/81 |
| 2005/0145991 A1 * | 7/2005 | Sakamoto et al. | .......... | 257/604 |
| 2005/0248259 A1 * | 11/2005 | Chang | ........................ | 313/498 |
| 2005/0269587 A1 * | 12/2005 | Loh et al. | ..................... | 257/99 |
| 2005/0270666 A1 * | 12/2005 | Loh et al. | .................... | 359/726 |
| 2006/0071222 A1 * | 4/2006 | Yasuda et al. | ................ | 257/90 |
| 2006/0157726 A1 * | 7/2006 | Loh et al. | ................... | 257/100 |

FOREIGN PATENT DOCUMENTS

JP 3-148896 * 6/1991

* cited by examiner

*Primary Examiner*—Tho D. Ta

(57) ABSTRACT

In one embodiment, an LED is constructed with its entire contact structure stamped and inserted into the molded lamp as a single structure. A portion of the contact structure is imbedded in the molded lamp such that the bottom surface of the contacts do not extend below the base of the molded lamp. The base of the molded lamp is made wide enough to give support to the entire structure. Using this concept, any excess contact structure is cutoff and there is no need for bending of the contact structure to form the contact portions. In some embodiments, the cross-sectional area of the lamp base is extended to increase stability of the lamp when the lamp base is mounted on a flat surface.

10 Claims, 4 Drawing Sheets

SYSTEM AND METHOD FOR INCREASING THE SURFACE MOUNTING STABILITY OF A LAMP

BACKGROUND

It is now common practice to mount lamps, such as LEDs, on flat surfaces such as substrates. LEDs, particularly those designed for surface mounting have shells that are typically cylindrical in shape with the top portion formed to allow light from the LED elements to escape. Contacts, typically constructed from a metal stamping, extend outward from the bottom portion of the lamp shell. These contacts add height to the structure and thus are not practical where space is limited.

In addition, in order to gain stability for the lamp (i.e., preventing the lamp from wobbling or being mounted in a "tipped" position), there must be a relatively wide physical connection between the lamp and the mounting surface. To achieve such stability it is necessary to bend the contacts to form pads for support purposes. Such bending is costly from a manufacturing point of view and unless each contact of a lamp is precisely bent, so that the bottom surfaces of each contact are in the same plane, the lamp will tip one way or the other.

SUMMARY

In one embodiment, an LED is constructed such that its entire contact structure is stamped and inserted into a lamp shell as a single structure. A portion of the contact structure is imbedded in the lamp shell such that the bottom surface of the contacts do not extend below the base of the lamp shell. In one embodiment, the base of the lamp shell is made wide enough to give support to the entire structure. Any excess contact structure is cutoff and there is no need for bending of the contact structure to form the contact portions. In some embodiments, the cross-sectional area of the lamp base is extended to increase stability of the lamp when the lamp base is mounted on a flat surface.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 6:
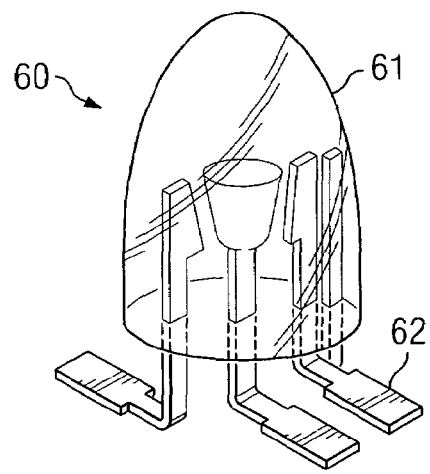
FIGS. 6 and 7 show examples of prior art lamps and the contacts extending therefrom.
Figure 7:
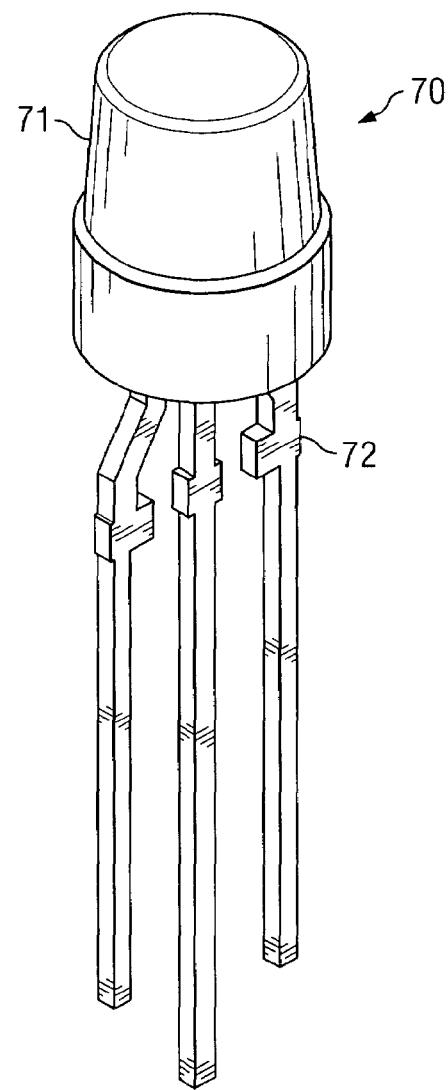

Prior to beginning the description of the concepts of the instant invention it might be well to look at examples of prior art with respect to FIGS. 6 and 7. FIG. 6 shows LED 60 which has lamp shell 61 and contacts 62 extending from the base of the lamp shell. As noted, contacts 62 are bent so as to form a platform to allow both electrical contact and stability of the lamp. Note that if the contacts are not bent exactly evenly then the lamp shell 61 will tilt one way or the other, thereby changing the intensity of the light in an unwanted manner. Similarly, lamp 70 shown in FIG. 7 has long legs of contacts which could either be extended through a circuit board or mounted on the surface by bending the legs one way or another. Device 70 suffers from the same problems as does device 60.

Figure 1A:
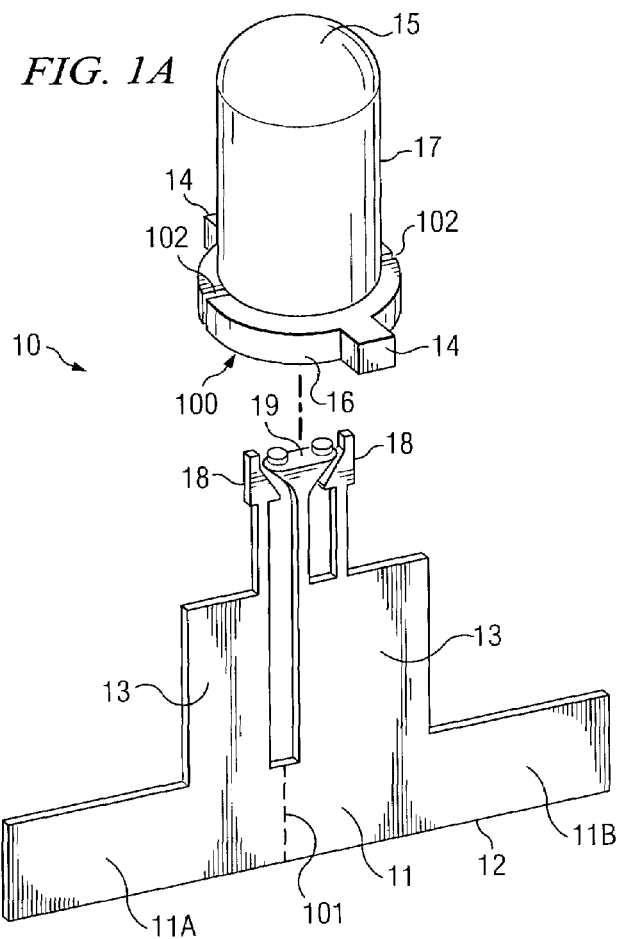
FIG. 1A shows one embodiment of the invention in which the lamp shell is separate from the contact structure.
Figure 1B:
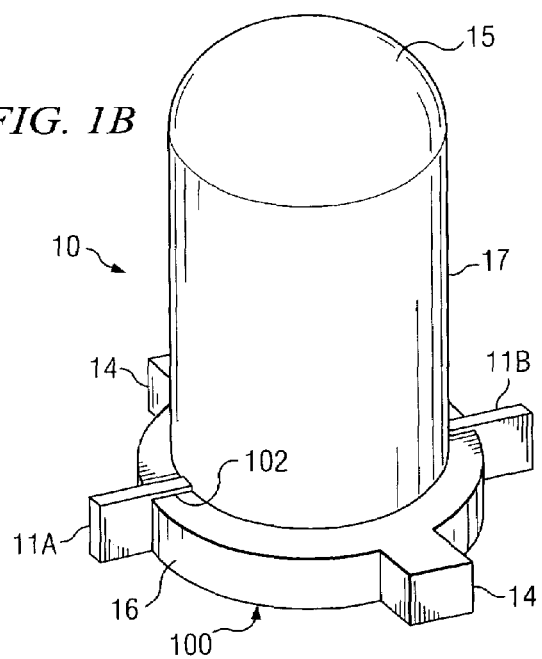
FIG. 1B shows the contact structure mated with the lamp shell.

Turning now to FIG. 1A, there is shown LED device 10 which could be an SMT based lamp. Contained within shell 17 are the elements, such as elements 19, which make the LED light work properly, including, if desired, focusing elements. Contact structure 13 has top areas 18 for contacting with elements 19 within shell 17. Contact structure 13 also has contact area 11 which has a bottom surface 12 and side contact areas 11A and 11B. Contact structure 13 is manufactured in one embodiment by a single stamping process and when contact structure 13 is mated inside shell 17, bottom surface 12 lies parallel to or above bottom surface 100 of shell 17 as shown in FIG. 1B. Light from the enabled LED shines from top 15 of shell 17.

As shown in FIG. 1B, contact portions 11a and 11b extend from slots 102 in shell 17. Once contact structure 13 is fully mated within shell 17 it can be cut along dotted line 101 for electrical and mechanical isolation. Shell 17 provides the structure to hold the contacts and the elements associated therewith steady. At the same time the contacts are either flush with the bottom surface of shell 17 or above the bottom surface. Thus, bottom surface 100 of shell 17 provides stability for maintaining the LED in the proper orientation such that top 15 is positioned in the desired plane. Bottom area 100 of shell 17 can be expanded, for example, by extension legs 14 to provide a wider surface area to increase stability.

Figure 2A:
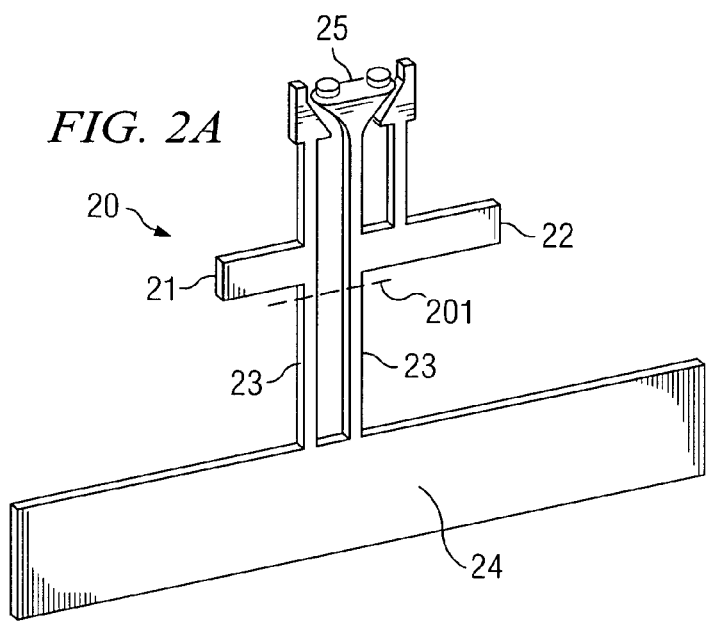
FIGS. 2A and 2B, 3A and 3B show alternate embodiments of the contact structure of the present invention.
Figure 2B:
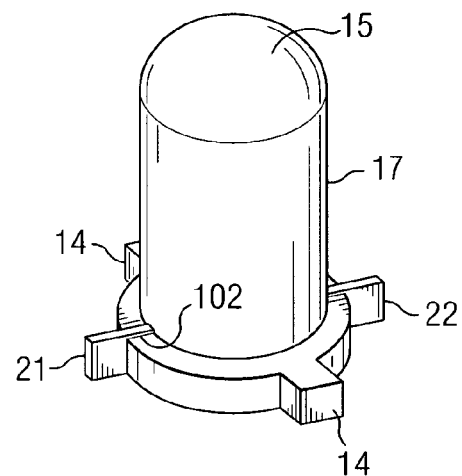

FIG. 2A shows alternate contact structure 20 using narrowly formed contact areas 23 and contacts 21 and 22 extending perpendicularly outward from risers 23. The bottom surface of extensions 21 and 22 form the contacts in the finished structure as shown in FIG. 2B. After structure 20 is mated with shell 17 structure 20 can be cut along line 201 so that portions 23 and 24 can fall away. During manufacture, portion 24 maintains the stability and rigidity of structure 23 so that it can be inserted properly within shell 17.

Figure 3A:
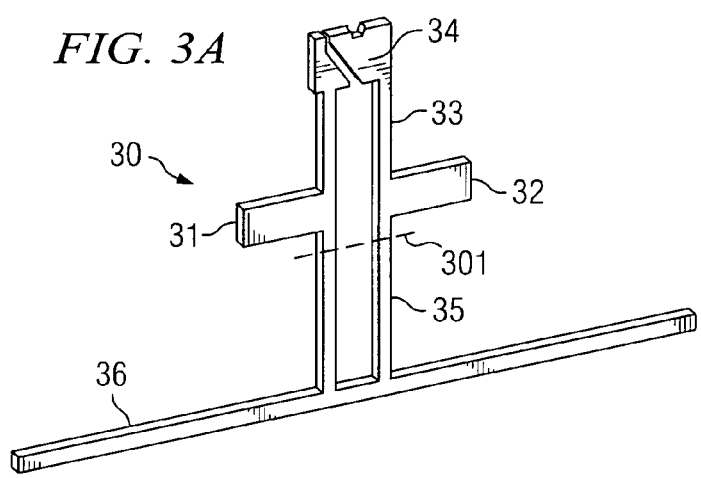
Figure 3B:
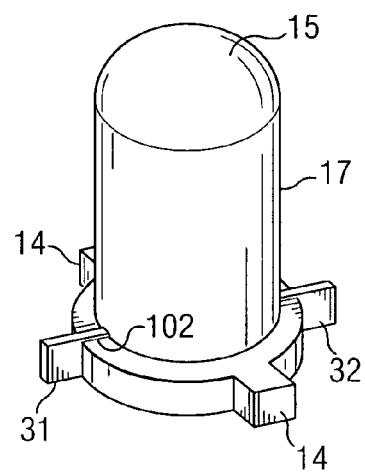

FIG. 3A shows an alternative contact structure 30 where contacts 31 and 32 are formed on riser sections 35. Again, riser sections 35 and base 36 are cut off along cut off line 301 when structure 30 is mated with shell 17 (FIG. 3B).

Figure 4:
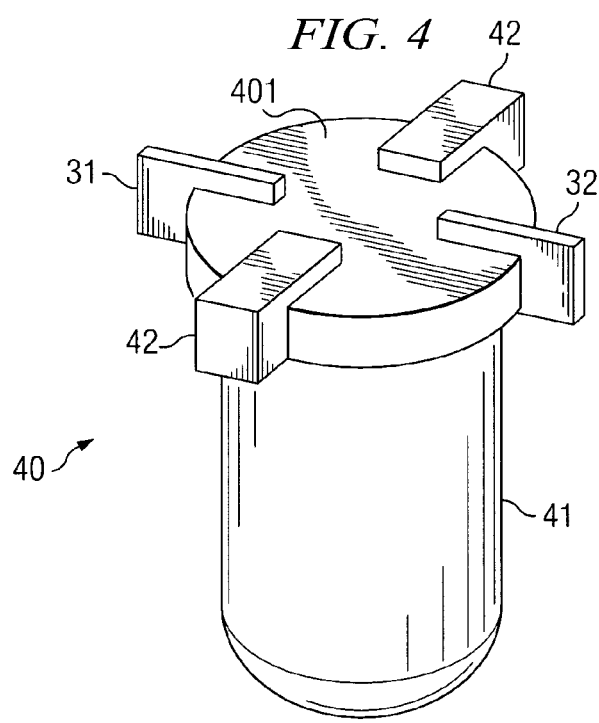
FIG. 4 shows an alternate embodiment of the lamp shell having legs thereon.

FIG. 4 shows an alternative embodiment 40 having shell 41 with contacts 31 and 32 extending circumferentially outward therefrom as discussed above. Shell 41 also has two legs, 42 and 43, extended below (above in FIG. 4) base surface 401 so that the base of these legs, or feet, are in the same plane as the bottom of contacts 31 and 32 so as to provide additional support. There can be as many legs as desired to form a plane and the legs be molded as a part of shell 41 as desired.

Figure 5A:
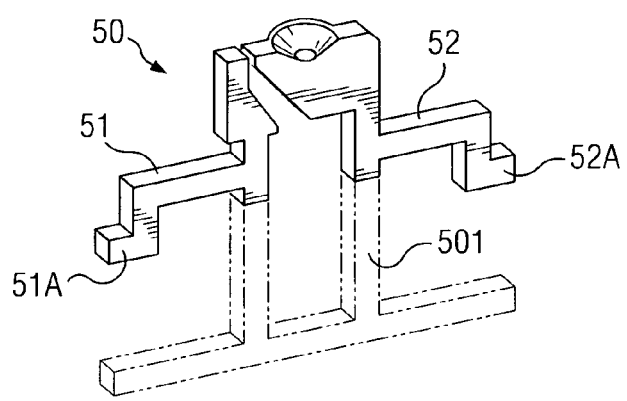
FIGS. 5A and 5B show an alternate embodiment where the legs extend circumferentially from the lamp shell.
Figure 5B:
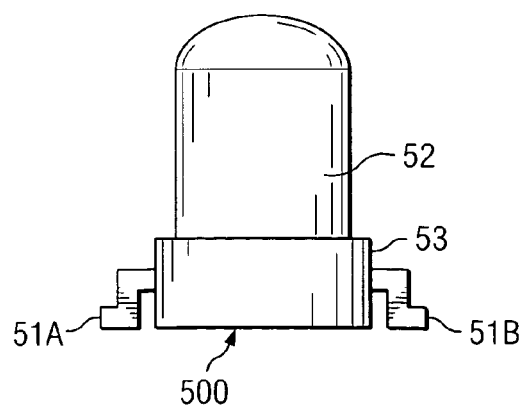

FIG. 5A shows alternative contact structure 50 where the contact structure can have feet, such as feet 51a and 52a that extend outward even further than the outer circumference of shell 52 (FIG. 5B) such that when contact structure 50 is mated inside shell 52, feet 51a and 51b extend circumferentially outward to increase stability. Also note that base portion 53 of lamp shell 52 can be made larger than the body of the shell. By making the bottom surface of contacts 51A and 51B flush with bottom surface 500 of shell 52, added support and structural stability is imparted to the device when it is mounted on a flat surface. Structure 50 can, if desired, be constructed in a single stamping and excess material 501 can be cut away once structure 50 is mated with shell 52.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An LED comprising:
    a premolded lamp shell having contained therein at least one LED structure adapted for mating with electrical contacts, said lamp shell having a base which comprises a lower surface and an area for receiving said electrical contacts; and
    at least one set of contacts formed on a single structure and adapted to be inserted inside said lamp shell via said lamp base, said set of contacts having at least one laterally extending portion, said laterally extending portion for extending circumferentially outward of said lamp base and said laterally extending portion having a bottom surface adapted to not extend below the lower surface of said lamp base.

2. The LED of claim 1 wherein said lamp shell is circular.

3. The LED of claim 2 wherein said lamp base has a portion with a circumference larger than the circumference of the main portion of said lamp shell.

4. The LED of claim 3 wherein said wider circumference is large enough to provide stability for mounting said LED to a substrate.

5. The LED of claim 1 wherein said premolded lamp shell base has constructed thereon at least one protruded leg for providing stability for mounting said LED to a substrate.

6. The LED of claim 5 wherein the base of said protruded leg is on the same plane as the base of said laterally extending portion.

7. A lamp shell comprising:
    a cylindrical portion having a top for allowing light to escape;
    a base portion for mounting on a substrate, said base portion having a lower surface having a cross-sectional area large enough to maintain said cylindrical portion stable when said base portion is in contact with a flat surface, said base portion comprising:
    means for receiving a contact structure, said contact structure having a proximal end for mating with light producing elements within said cylindrical portion of said lamp shell and externally extending portions for extending circumferentially outward from said base portion for receiving electrical power from an external source, said externally extending portions each comprising a bottom edge; and
    at least two areas positioned to receive and support said externally extending portions such that the bottom edge of each of said externally extending portions does not extend below said lower surface of said base portion.

8. The lamp shell of claim 7 wherein said bottom edge of each of said externally extending portions operates in conjunction with said lower surface of said base portion to cause said cylindrical portion of said lamp shell to experience an increase in stability when said base portion is in contact with said flat surface.

9. The lamp shell of claim 8 wherein said receiving means comprises at least a pair of slits on opposite circumferentially edges of said lamp base.

10. An LED comprising:
    a premolded lamp shell having contained therein at least one LED structure adapted for mating with electrical contacts, said lamp shell having a base which comprises a lower surface and an area for receiving said electrical contacts; and
    at least one set of contacts formed on a single structure and adapted to be inserted inside said lamp shell via said lamp base, said single structure comprising at least one section thereof which, when cut, will separate said set of contacts into two separate contact members, said set of contacts having at least one laterally extending portion, said laterally extending portion for extending circumferentially outward of said lamp base and said laterally extending portion having a bottom surface adapted to not extend below the lower surface of said lamp base.

* * * * *

UNITED STATES PATENT AND TRADEMARK OFFICE
CERTIFICATE OF CORRECTION

| | | |
|---|---|---|
| PATENT NO. | : 7,326,062 B2 | Page 1 of 1 |
| APPLICATION NO. | : 11/052385 | |
| DATED | : February 5, 2008 | |
| INVENTOR(S) | : Chai Kok-Soon et al. | |

It is certified that error appears in the above-identified patent and that said Letters Patent is hereby corrected as shown below:

Cover Page, item (75), (Inventors), Line 2, delete "Penanag" and insert -- Penang --;

Column 4, Line 31-32, Claim 9, delete "circumferentially" and insert -- circumferential --.

Signed and Sealed this

First Day of June, 2010

David J. Kappos
*Director of the United States Patent and Trademark Office*